(12) United States Patent
Schuler et al.

(10) Patent No.: US 7,528,038 B2
(45) Date of Patent: May 5, 2009

(54) NON-VOLATILE TWO-TRANSISTOR SEMICONDUCTOR MEMORY CELL AND METHOD FOR PRODUCING THE SAME

(75) Inventors: Franz Schuler, Dresden (DE); Georg Tempel, Dresden (DE)

(73) Assignee: Infineon Technologies AG, Munich (DE)

( * ) Notice: Subject to any disclaimer, the term of this patent is extended or adjusted under 35 U.S.C. 154(b) by 238 days.

(21) Appl. No.: 10/501,406

(22) PCT Filed: Dec. 10, 2002

(86) PCT No.: PCT/DE02/04522

§ 371 (c)(1),
(2), (4) Date: Jan. 7, 2005

(87) PCT Pub. No.: WO03/061014

PCT Pub. Date: Jul. 24, 2003

(65) Prior Publication Data

US 2005/0121714 A1 Jun. 9, 2005

(30) Foreign Application Priority Data

Jan. 15, 2002 (DE) .................. 102 01 304

(51) Int. Cl.
*H01L 21/336* (2006.01)
(52) U.S. Cl. .................. 438/264; 438/591; 438/954; 257/E23.013
(58) Field of Classification Search ............ 365/185.33, 365/185.29; 438/3, 264, 526, 591, 954
See application file for complete search history.

(56) References Cited

U.S. PATENT DOCUMENTS

| | | | | |
|---|---|---|---|---|
| 5,753,953 | A | | 5/1998 | Fukumoto .................. 257/316 |
| 5,930,629 | A | * | 7/1999 | Fukumoto .................. 438/261 |
| 5,963,480 | A | * | 10/1999 | Harari .................. 365/185.29 |
| 6,011,725 | A | * | 1/2000 | Eitan .................. 365/185.33 |
| 6,215,148 | B1 | | 4/2001 | Eitan .................. 257/316 |
| 6,271,090 | B1 | | 8/2001 | Huang et al. .................. 438/264 |
| 2002/0084484 | A1 | | 7/2002 | Kurihara et al. .................. 257/315 |
| 2004/0097037 | A1 | | 5/2004 | Hofmann et al. .................. 438/257 |

FOREIGN PATENT DOCUMENTS

| | | |
|---|---|---|
| EP | 1 170 800 A2 | 1/2002 |
| JP | 09312352 A | 2/1997 |
| WO | WO 01/17030 A1 | 3/2001 |
| WO | WO 01/18878 A1 | 3/2001 |
| WO | WO 02/11145 A2 | 2/2002 |

OTHER PUBLICATIONS

Office Action issued in European counterpart application No. 02 791 621.2-2203, 7 pages dated Mar. 12, 2008.

* cited by examiner

*Primary Examiner*—Wai-Sing Louie
(74) *Attorney, Agent, or Firm*—Brinks Hofer Gilson & Lione

(57) ABSTRACT

The invention relates to a nonvolatile semiconductor memory cell and to an associated fabrication method, a source region (7), a drain region (8) and a channel region lying in between being formed in a substrate (1). In order to realize locally delimited memory locations (LB, RB), an electrically non-conductive charge storage layer (3) situated on a first insulation layer (2) is divided by an interruption (U), thereby preventing, in particular, a lateral charge transport between the memory locations (LB, RB) and significantly improving the charge retention properties.

11 Claims, 4 Drawing Sheets

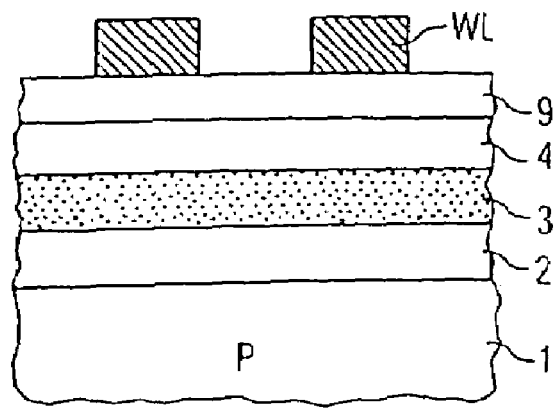
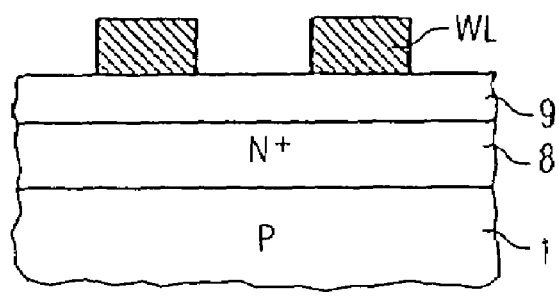
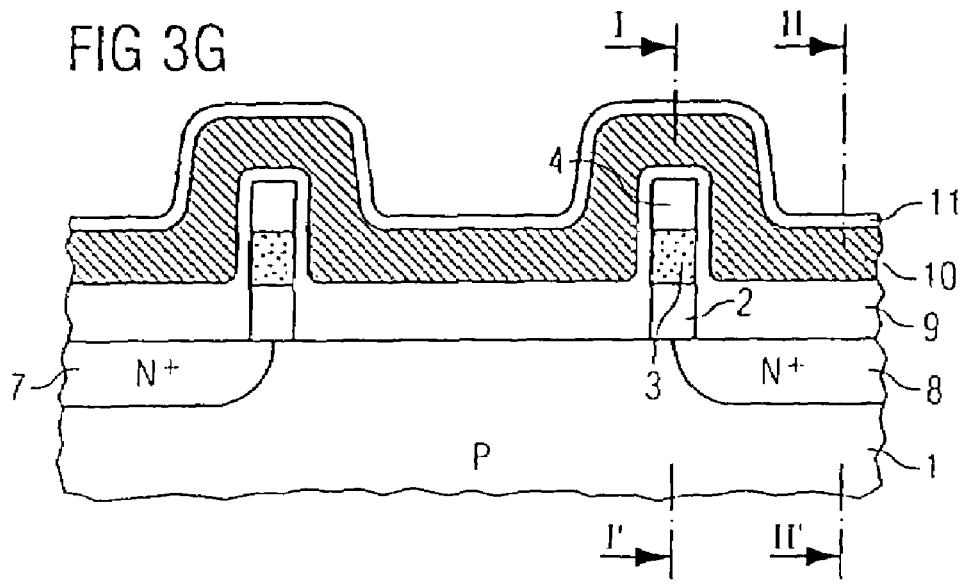
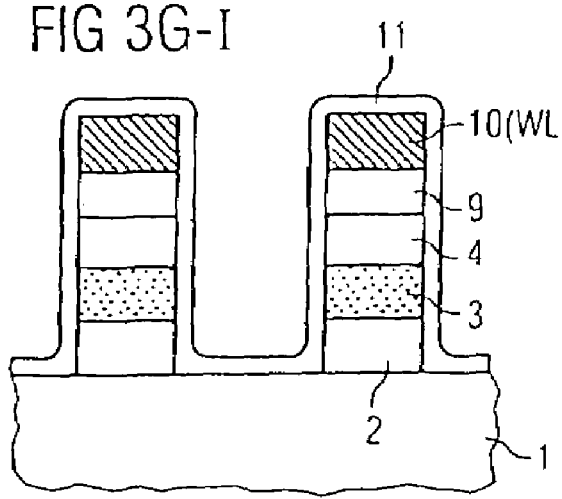
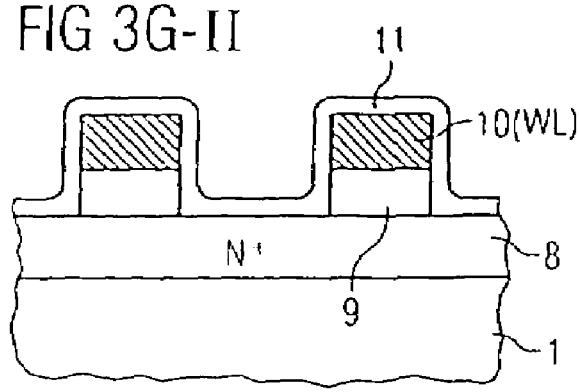

NON-VOLATILE TWO-TRANSISTOR SEMICONDUCTOR MEMORY CELL AND METHOD FOR PRODUCING THE SAME

PRIORITY AND CROSS REFERENCE TO RELATED APPLICATIONS

This application is related to and claims the benefit of priority under 35 U.S.C. §§ 120 and 365 of international patent application number PCT/DE02/04522, filed on Dec. 10, 2002, which was published as international publication number WO03/061014 A1, in German.

This application is further related to and claims the benefit of priority under 35 U.S.C. §§ 119 to the filing date of Jan. 15, 2002 of German patent application number 10201304.7, filed on Jan. 15, 2002.

The present invention relates to a nonvolatile semiconductor memory cell and to an associated fabrication method and, in particular, to a so-called dual bit EEPROM memory cell.

As an alternative to conventional mechanical storage devices, recently nonvolatile semiconductor memory devices having nonvolatile semiconductor memory cells such as, for example, FLASH, EPROM, EEPROM, FPGA memory cells and the like have gained greater and greater acceptance. Such rewritable nonvolatile semiconductor memory cells can store data over a long period of time and without the use of a voltage supply.

Such semiconductor memory cells usually comprise a semiconductor substrate, an insulating tunnel layer, a storage layer, an insulating dielectric layer and a conductive control layer. In order to store information, charges are introduced into the charge-storing layer from a semiconductor substrate. Examples of methods for introducing the charges into the storage layer are injection of hot charge carriers and Fowler-Nordheim tunnelling.

In particular, an information content per unit area, the charge retention properties and the operating voltages for reading and programming are of importance in the realization of such nonvoltatile semiconductor memory cells. In order to improve a charge retention time, in this case use has increasingly been made in particular of nonvolatile semiconductor memory cells with electrically non-conductive charge storage layers, as a result of which, even in the case of partly inadequate insulation layers, a leakage current can be prevented and the charge retention properties can thus be improved.

Furthermore, so-called multibit semiconductor memory cells have been developed, which can realize a multiplicity of information contents or bits in a memory cell. The information content per unit area has been able to be significantly improved in this way.

The present invention relates, in particular, to a dual bit semiconductor memory cell with which two bits can be stored in nonvolatile fashion.

Such a dual bit semiconductor memory cell is known for example from the document U.S. Pat. No. 6,011,725 and is described below by means of FIG. 1.

In accordance with FIG. 1, such a two-bit EEPROM memory cell has a semiconductor substrate 1, which is p-doped, for example, and which has an n⁺-doped source region 7 and drain region 8 with associated terminals source and drain terminals S and D. It should be pointed out that a symmetrical construction is used in such a cell, for which reason the terms source and drain are not necessarily meaningful. In actual fact, the source region 7, for example, can also be connected as the drain region and the drain region 8 can also be connected as the source region.

In accordance with FIG. 1, the source and drain regions 7 and 8 define a channel region lying in between. A first insulation layer 2, an electrically non-conductive charge storage layer 3, a second insulation layer 4 and an electrically conductive control layer 10, which has a gate terminal G, are situated at the surface of said channel region. In accordance with FIG. 1, silicon nitride is used as the electrically non-conductive charge storage layer 3. For the programming, i.e. writing and erasing of this conventional nonvolatile semiconductor memory cell, an injection of hot charge carriers is essentially carried out, in which case, for writing, for example hot electrons are injected into the charge storage layer 3 on the drain side and, for erasing, hot holes are injected on the drain side. Since a symmetrical dual bit memory cell is involved, it is also possible, in the same way, for charge carriers to be injected into the charge storage layer 3 on the source side, in which case, however, the source region 7 is connected as the drain. With regard to the method for reading from, writing to and erasing such a memory cell, reference is explicitly made to the document U.S. Pat. No. 6,011,725.

Although extraordinarily high charge retention properties are already obtained at relatively low programming voltages in the case of such a conventional semiconductor memory cell, disadvantages have nonetheless been found which are of importance in particular in the case of a multiple programming over a long period of time. This is due in particular to the fact that the hot holes required for erasing are generally generated by means of an avalanche effect in the field of the p-n diode and therefore do not fall exactly at the same place in the charge storage layer 3 as the hot electrons introduced in the course of writing. For a memory location RB (right bit) arranged on the right, in the same way as for a left memory location LB (left bit) arranged on the source side, the problem arises that the electrons and holes are not introduced exactly at the same place and, consequently, a slight charge shift takes place. This imprecise compensation generally leads to threshold value shifts in the memory cell and thus to read current changes. This in turn causes an increased inaccuracy in an evaluation circuit (not illustrated).

A further point whereby the charge retention properties of this conventional semiconductor memory cell are adversely affected is caused by the fact that even though the charge storage layer 3 is electrically non-conductive, a small charge movement nevertheless takes place. This charge movement within the charge storage layer 3 is primarily based on drift and diffusion processes which lead to a slow redistribution of the charges in the charge storage layer 3. The illustration in accordance with FIG. 1 shows, by way of example, a solid charge distribution curve V, as results shortly after the writing of electrons, for example, at the local memory locations LB and RB. This distribution V changes, however, on account of drift and diffusion processes, the broadened distribution curve V' illustrated by a broken line being established in the charge storage layer 3 after a predetermined time has elapsed. However, the charge density stored in the local memory locations LB and RB is reduced as a result. The redistribution of the charges within the charge storage layer 3 alters the threshold voltage of the semiconductor memory cell, which in turn leads to a loss of information or at least to increased requirements in the evaluation circuit (not illustrated).

Therefore, the invention is based on the object of providing a nonvolatile semiconductor memory cell and an associated fabrication method in which improved charge retention properties are obtained.

According to the invention, this object is achieved by means of the features of Patent Claim 1 with regard to the memory cell and by means of the measures of Patent Claim 5 with regard to the method.

In particular as a result of the use of locally insulated non-conductive charge storage layers or an electrically non-conductive charge storage layer which has an interruption in order to form said locally delimited memory locations, it is possible firstly to reliably prevent a redistribution on account of the above-described drift and diffusion processes in the charge storage layer. Furthermore, it is possible to compensate for the different accuracies of introduction of holes and electrons into the storage layer, since the charge storage layer is only present locally in sharply delimited fashion.

Preferably, the first and second insulation layers also have an interruption or are not connected to one another in a continuous manner, thereby simplifying the fabrication.

In order to realize a semiconductor memory cell having outstanding electrical properties, a third insulation layer may furthermore be introduced in the region between the locally delimited memory locations or in the region of the interruption and may furthermore be coated with an electrically conductive control layer. The electrical properties are thereby improved particularly in the case of large-scale integrated circuits.

The first insulation layer preferably has a thickness which is greater than a material thickness required for direct tunnelling, as a result of which the charge retention properties, in particular, can be significantly improved.

Further advantageous refinements of the invention are characterized in the subclaims.

The invention is described in more detail below using an exemplary embodiment with reference to the drawing.

In the figures:

FIGS. 3A to 3G-II show simplified sectional views for illustrating essential fabrication steps for the nonvolatile semiconductor memory cell according to the invention.

FIG. 2 shows a simplified sectional view of a nonvolatile semiconductor memory cell according to the invention, identical reference symbols designating elements or layers identical or similar to those in FIG. 1, and a repeated description being dispensed with below.

The dual bit EEPROM memory cell described below corresponds to the dual bit memory cell in accordance with document U.S. Pat. No. 6,011,725 in particular with regard to the method for writing, reading and erasing information, for which reason reference is expressly made at this juncture to the method disclosed in said document and a repeated description is dispensed with.

Figure 1:
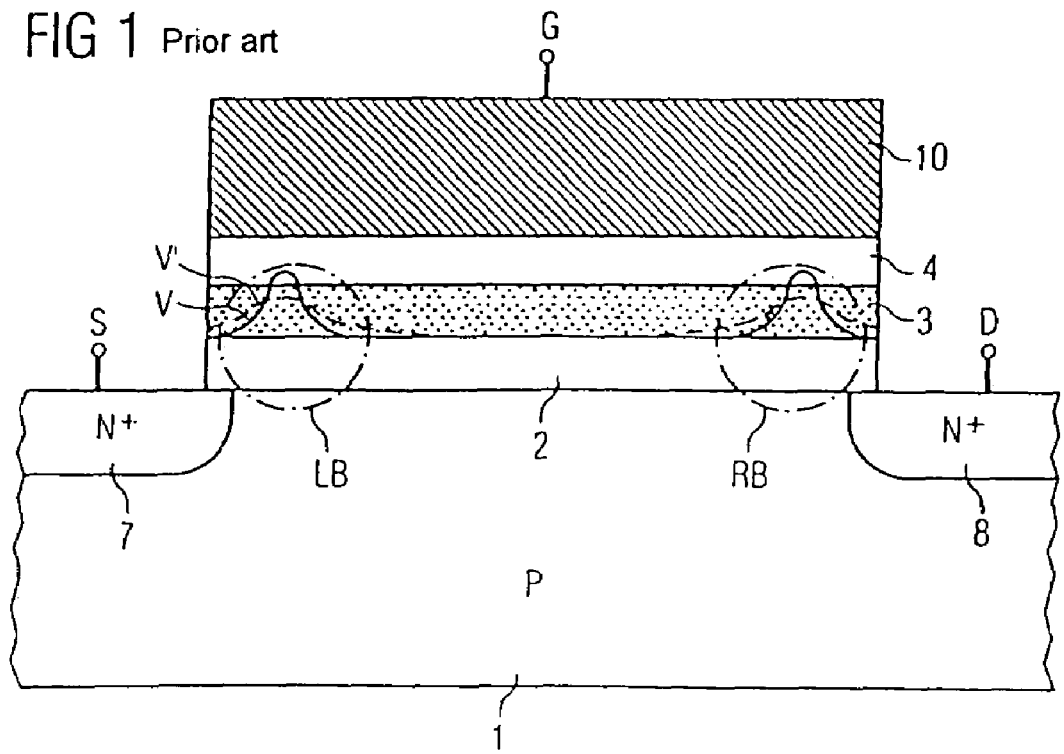
FIG. 1 shows a simplified sectional view of a semiconductor memory cell in accordance with the prior art.
Figure 2:
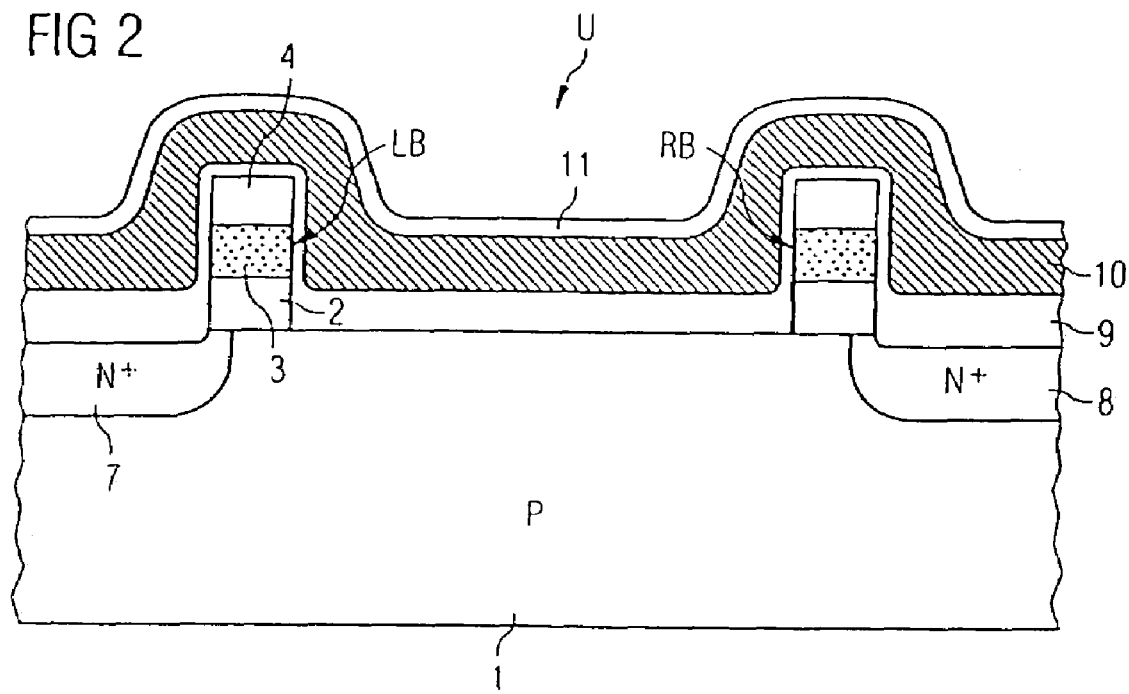
FIG. 2 shows a simplified sectional view of a nonvolatile semiconductor memory cell according to the invention.

In accordance with FIG. 2, the nonvolatile semiconductor memory cell designated as a dual bit EEPROM comprises a substrate 1, in which a source region 7, a drain region 8 and a channel region lying in between are formed in a manner comparable to a conventional field-effect transistor. By way of example, the substrate 1 is composed of a p-doped semiconductor material such as e.g. silicon. In the case of the NMOS memory cell illustrated, the source and drain regions are $n^+$-doped, for example. At the surface of the substrate 1, a first insulation layer 2 or a dielectric such as e.g. $SiO_2$ is in each case situated at least at a first locally delimited memory location LB (left bit) and a second locally delimited memory location RB (right bit). Situated above said layer is an electrically non-conductive charge storage layer 3, which is used for the actual storage of the charges introduced. Said electrically non-conductive charge storage layer 3 again comprises a dielectric such as e.g. $Si_3N_4$ or so-called "silicon rich oxide" $Si_{2+x}O$. At the surface of said charge storage layer 3, a second insulation layer 4 again made of a dielectric such as e.g. $SiO_2$ is furthermore situated at the locally delimited memory locations LB and RB. Accordingly, as in the case of the conventional dual bit semiconductor memory cell, a first local memory location LB (left bit) is formed on the source side and a second local memory location RB (right bit) is formed on the drain side, which critically influence a current flow in the channel region when predetermined voltages are applied, and are thus suitable for storing data, i.e. two bits.

In contrast to the conventional semiconductor memory cell, however, the electrically non-conductive charge storage layer 3 is now not connected together in a continuous manner, but rather is interrupted. By virtue of this interruption or gap U in the electrically non-conductive charge storage layer 3, a first locally delimited memory location LB on the source side and a second locally delimited memory location RB on the drain side are formed in a completely isolated manner, as a result of which the drift and diffusion processes described in the introduction cannot lead to a loss of data. The charge density in the locally delimited memory locations LB and RB thus remains unchanged, for which reason outstanding charge retention properties are obtained.

What is more, however, the formation of the locally delimited memory locations LB and RB improves the electrical properties of the nonvolatile semiconductor memory cell. As has already been described in the introduction, the process of writing to the memory locations or the introduction of charges into the memory locations is effected by injection of hot charge carriers such as for example in this case by the injection of electrons which are accelerated in the channel region in such a way that they can surmount the energy barrier of the first insulation layer 2 and pass into the electrically non-conductive charge storage layer 3. On the other hand, however, these data are erased by a compensation of the introduced charges with correspondingly opposite charges. By way of example, for erasure purposes, hot holes are injected into the locally delimited memory locations LB and RB. However, since hot holes are usually generated by means of an avalanche effect in the pn diode region at drain or source, the exact location at which the holes ultimately end up in the charge storage layer 3 can be determined beforehand only with very great difficulty and generally differs from the locations of the electrons. This inaccuracy resulting from the programming is compensated for according to the invention by the locally delimited memory locations LB and RB since, even in the event of a wholly inaccurate erasing operation which takes place for example in an offset manner with respect to the distribution density of the electrons, the latter are left out of consideration and, consequently, do not adversely affect for example the threshold voltages of the memory cell. Only the holes actually introduced into the locally delimited memory locations LB and RB take effect for a compensation of the electrons.

Consequently, there is an improvement not only in the charge retention properties but also in the fundamental electrical properties of the nonvolatile semiconductor memory cell. In particular, the alteration of the threshold voltages after repeated writing and erasing operations is significantly reduced compared with the standard case. Since the charge storage regions are now restricted to LB and RB, there are now less stringent requirements made of the accurate superposition of both charge distributions. A further advantage is thus a simplified development of the pn diode and less critical producibility.

The first insulation layer 2 preferably has a thickness which is greater than a thickness required for a respective material for direct tunnelling. As a result, it is possible to reliably prevent charge losses on account of direct tunnelling. The same also applies to the second insulation layer 4 situated above the charge storage layer 3.

In accordance with FIG. 2, it is not only the electrically non-conductive charge storage layer 3 that has an interruption U, but also the first and second insulation layers 2 and 4. As a result, locally highly delimited layer stacks are produced at the locally delimited memory locations LB and RB, the remaining region in particular at the surface of the channel region being free of said layers. In accordance with FIG. 2, a third insulation layer 9, which again has a dielectric such as e.g. $SiO_2$, is thus situated at the surface of the substrate 1 and the locally delimited layer stack comprising the layers 2, 3 and 4. An electrically conductive control layer 10 is formed at the surface of said third insulation layer 9, as a result of which the gap or the interruption U between the locally delimited memory locations or the source and drain regions 7 and 8 is at least partly filled. A fourth insulation layer 11 may optionally be formed at the surface of the electrically conductive control layer 10, a post-oxide being used, by way of example.

A method for fabricating the nonvolatile semiconductor memory cell illustrated in FIG. 2 is described below with reference to FIGS. 3A to 3G-II, identical reference symbols designating identical or corresponding layers and a repeated description being dispensed with below.

Figure 3A:
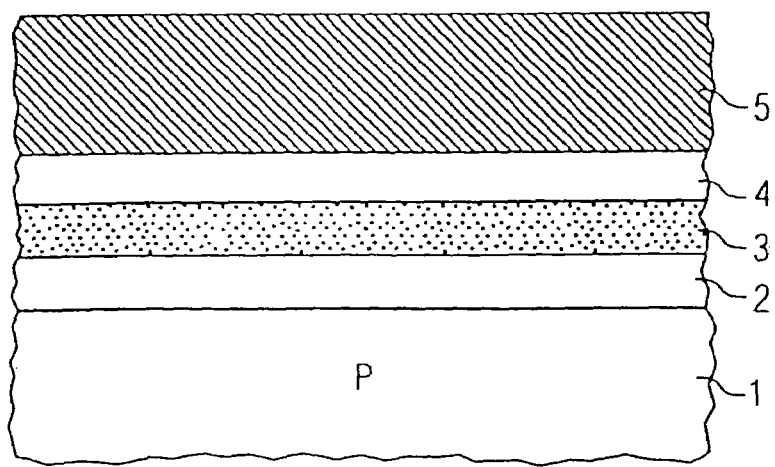

In accordance with FIG. 3A, firstly a first insulation layer 2, an electrically non-conductive charge storage layer 3, a second insulation layer 4 and a mask layer 5 are formed on a substrate 1, which has a p-doped silicon semiconductor substrate, by way of example. In order to avoid direct tunnelling effects, the first insulation layer comprises an $SiO_2$ layer having a thickness of approximately 8 to 10 nm. Direct tunnelling occurs for $SiO_2$ typically in the case of layer thicknesses of less than 4 to 6 nm. The electrically non-conductive charge storage layer comprises an $Si_3N_4$ layer having a thickness of a few nm, but may also have so-called "silicon rich oxide", i.e. $Si_xO_y$. Silicon dioxide having a thickness of 6 to 10 nm, for example, is used for the second insulation layer 4, as a result of which a direct tunnelling is also prevented in this direction. The mask layer 5 is composed, for example, of a material present in a respective standard process, such as e.g. polysilicon.

Figure 3B:
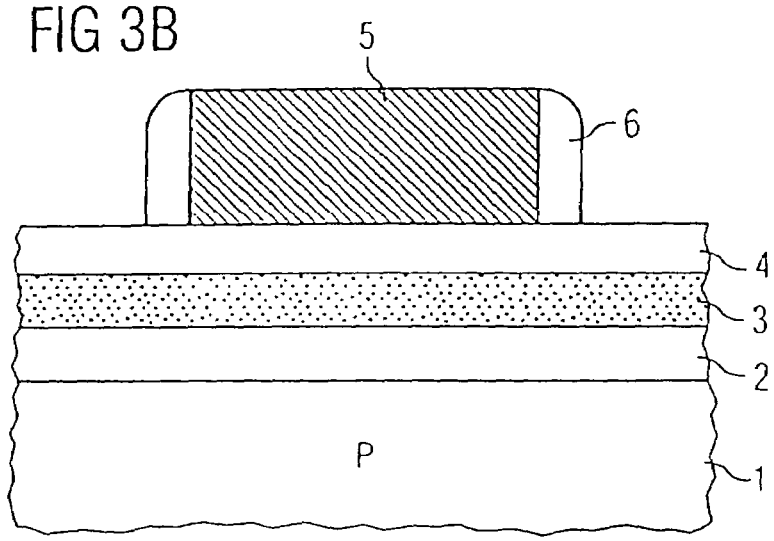

In accordance with FIG. 3B, in a subsequent step, the mask layer 5 is patterned for example by conventional photolithographic or other methods and an intermediate layer is subsequently formed. Said intermediate layer comprises a conformally deposited $Si_3N_4$ layer, which is subsequently used in a conventional etching-back step for fabricating the sidewall layers or spacers 6 illustrated in FIG. 3B.

In order to form the layers 2 to 6 described above, it is possible to use all methods that are known for a respective material, such as e.g. CVD (chemical vapour deposition), epitaxial methods and/or thermal oxidation.

Figure 3C:
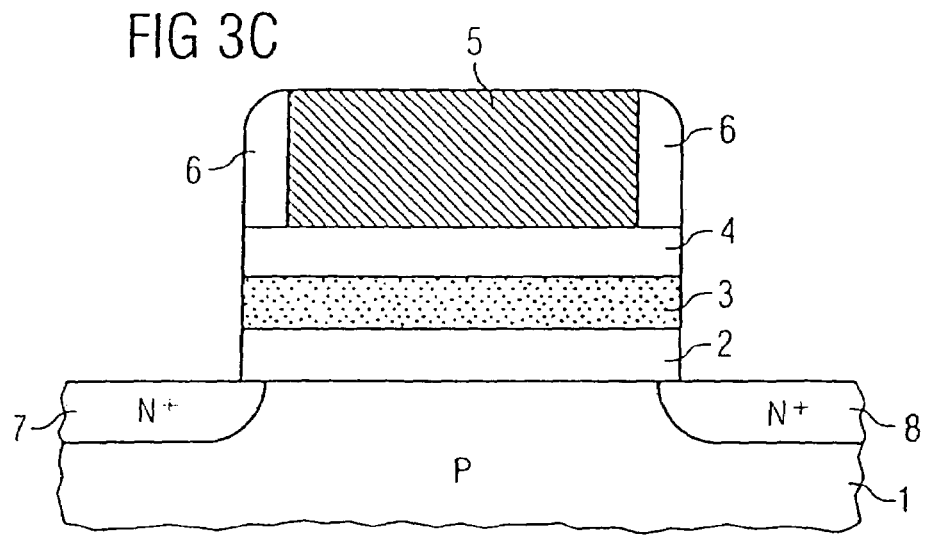

In accordance with FIG. 3C, at least the second insulation layer 4 and the charge storage layer 3 are then removed using the patterned mask layer 5 and the sidewall layers or spacers 6 formed thereon and the source and drain regions 7 and 8 are subsequently formed in a self-aligning manner in the substrate 1 by means of ion implantation for example. In this case, the first insulation layer 2 serves as screen material or screen oxide for avoiding so-called "channelling effects".

In the same way, however, the $n^+$-doped source and drain regions can also be implemented by direct implantation into the semiconductor substrate 1, the first insulation layer 2 also being removed during the patterning using the patterned mask layer 5 and the sidewall layer 6. It goes without saying that so-called pocket implantations can also be inserted. The source and drain regions 7 and 8 also simultaneously realize the bit lines of the nonvolatile semiconductor memory cell or at least the terminal regions for the bit lines.

The fabrication methods for patterning and removing the layers described above correspond to conventional patterning and etching methods, anisotropic etching methods preferably being carried out.

Figure 3D:
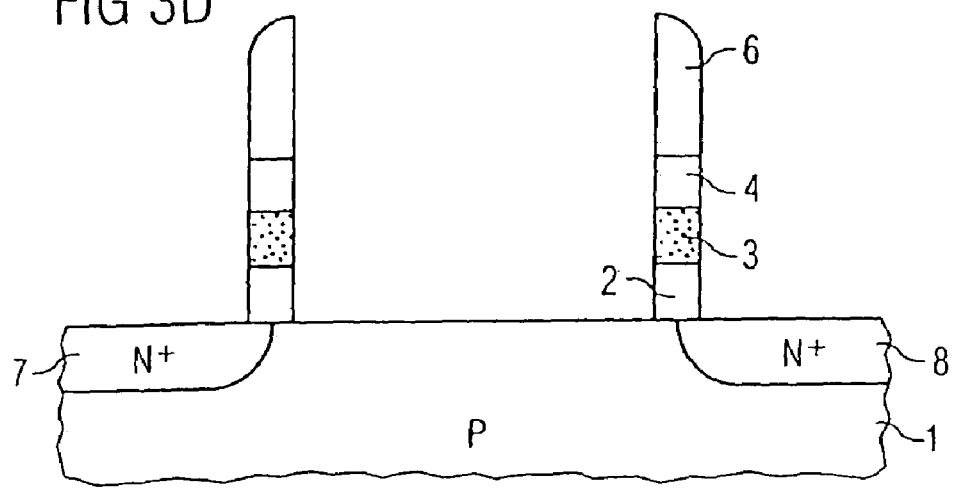

In accordance with FIG. 3D, in a subsequent method step, the remaining mask layer 5 and also the second insulation layer 4, the charge storage layer 3 and the first insulation layer 2 are removed using the sidewall layers or spacers 6. Anisotropic etching (RIE, reactive ion etching) is once again preferably carried out in this case, but a degree of thinning of the substrate may result in the source and drain regions 7 and 8. This thinning of the substrate 1 as a result of the etching-back process is generally negligible, however, since it does not cause any negative effects on the electrical or other properties of the process or of the memory cell thus fabricated. In this way, an interruption or gap U is obtained for forming locally delimited memory locations LB and RB, which are arranged essentially in a self-aligning manner on the source side and on the drain side in each case at the end of the channel. The width of said locally delimited memory locations can be set very precisely by the spacer technique used for forming the sidewall layers 6, as a result of which said memory locations can be defined and arranged exactly even in a sub-μm or sub-100 nm regime. As a result, in particular the electrical properties of the memory cell can be greatly improved in the case of high miniaturization.

Figure 3E:
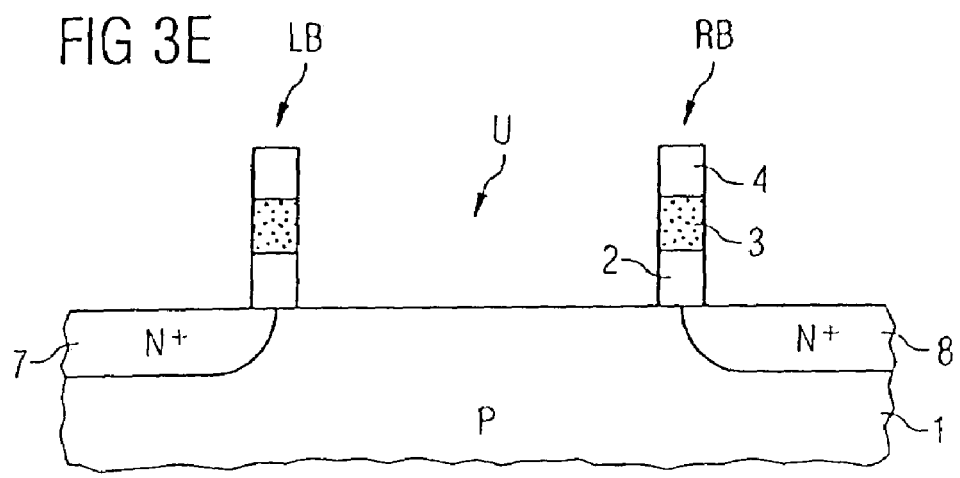

In accordance with FIG. 3E, in a subsequent method step, the sidewall layer or the spacer 6 is removed, conventional selective wet etching methods being used, by way of example. In the example of an $Si_3N_4$ spacer 6, hot phosphoric acid can be used for this purpose.

Figure 3F:
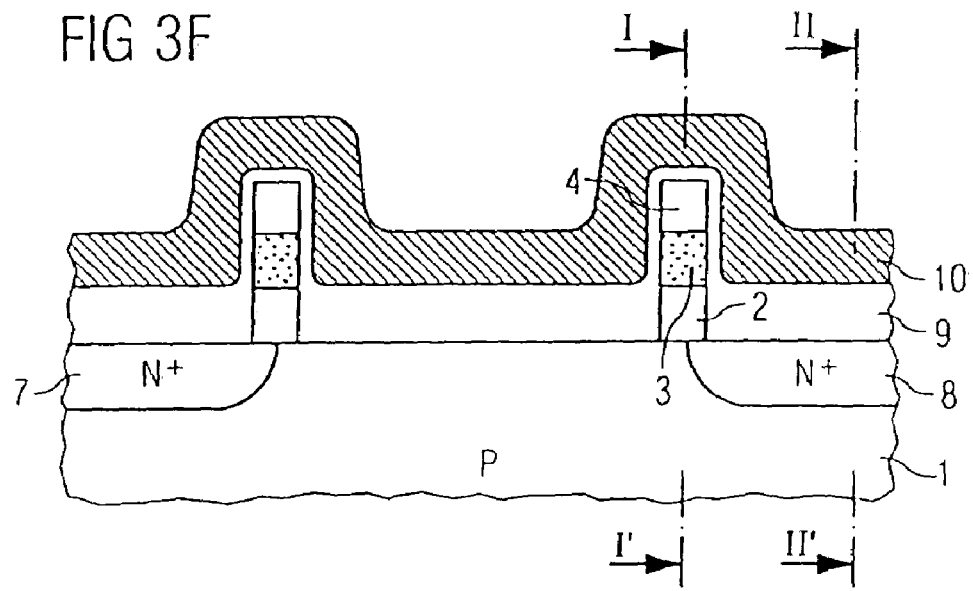

In accordance with FIG. 3F, in a subsequent method step, a third insulation layer 9, which essentially represents a gate oxide layer and is composed of thermally formed $SiO_2$, for example, is formed over the whole area. In this way, the layer stacks at the locally delimited memory locations also obtain a sufficient sidewall insulation. This sidewall insulation is preferably again set to a thickness which prevents direct tunnelling. An electrically conductive control layer 10 is subsequently formed, a highly doped polysilicon layer or a metal being deposited, by way of example. It is also possible to use other electrically conductive layers, such as e.g. siliconized semiconductor materials.

Furthermore, at this point in time the electrically conductive control layer 10 is patterned in order to form word lines or word line strips WL.

FIG. 3F-I and FIG. 3F-II show simplified sectional views of the sections I-I' and II-II' indicated in FIG. 3F for illustrating the layer structure after this patterning step.

In accordance with FIG. 3F-I, word lines WL arranged parallel are now situated at the surface of the third insulation layer 9, which was deposited or formed by thermal oxidation and is again situated on the layer stack comprising the first insulation layer 2, the charge storage layer 3 and the second insulation layer 4 on the semiconductor substrate 1.

On the other hand, in accordance with FIG. 3F-II, although the patterned word lines WL that run parallel are again situated on the third insulation layer 9, the latter is situated directly on the respective source and drain regions 7 and 8 and the substrate 1.

In accordance with FIG. 3G, in a further method step, the third insulation layer 9, the second insulation layer 4, the charge storage layer 3 and the first insulation layer 2 are selectively removed using the patterned control layer 10 or the word lines WL, as a result of which the locally delimited memory locations that were previously formed in strip form are now delimited in this direction as well. Locally delimited islands are thus produced for the memory locations LB and RB. In particular in the case of a matrix-type arrangement of the memory cells, a complete insulation on adjacent memory locations is thus produced as well. By way of example, an anisotropic etching method is again used in this case, a fourth insulation layer 11 finally being formed in particular for lateral insulation in this direction as well. This fourth insulation layer 11, designated as post-oxide (POX), again preferably has a layer thickness which prevents a direct tunnelling.

The corresponding sectional views I-I' and II-II' of FIG. 3G are again illustrated in FIG. 3G-I and FIG. 3G-II. Consequently, locally delimited memory locations LB and RB are obtained in this way, which can be defined and arranged very exactly in a simple manner in the form of islands by means of the respective method steps, as a result of which it is possible to significantly influence a drift and diffusion behaviour of introduced charges. In particular, the introduced charge carriers can now no longer migrate from one end of the channel to the other end of the channel, thereby preventing an unintentional alteration of the threshold voltages in the memory cell. What is more, an improved programming behaviour is obtained since a recombination (compensation) of positive and negative charges takes place significantly faster in this highly delimited space.

In particular when using so-called "silicon rich oxide" (SRO), it is furthermore possible to set the mobility of the charge carriers in the charge storage layer 3 by setting the Si proportion, as a result of which a lateral conductivity can also be set in a defined manner in the locally delimited memory locations. When $Si_3N_4$ is used, such setting of the mobility of the charge carriers in the charge storage layer 3 is effected directly by means of the deposition process chosen.

Furthermore, on account of the self-aligning processes, this memory cell is also suitable for very fine structures, it imposing only minor requirements on an evaluation circuit (not illustrated).

The invention has been described above on the basis of silicon semiconductor materials. However, it is not restricted thereto and also encompasses alternative semiconductor materials in the same way. Other charge-storing or insulating layers and alternative dopings can also be used in the same way.

The invention claimed is:

1. Method for fabricating a nonvolatile semiconductor memory cell, the method comprising the following steps:
   a) formation of a first insulation layer (2), an electrically non-conductive charge storage layer (3), a second insulation layer (4) and a mask layer (5) on a substrate (1);
   b) patterning of the mask layer (5);
   c) formation of sidewall layers (6) at the patterned mask layer (5);
   d) removal of at least a first portion of the second insulation layer (4) and a first portion of the charge storage layer (3) using the patterned mask layer (5) and the sidewall layer (6);
   e) formation of source and drain regions (7, 8) in the substrate (1);
   f) removal of the mask layer (5);
   g) removal of a second portion of the second insulation layer (4), a second portion of the charge storage layer (3) and a first portion of the first insulation layer (2) using the sidewall layers (6);
   h) removal of the sidewall layers (6);
   i) formation of a third insulation layer (9);
   j) formation of an electrically conductive control layer (10);
   k) patterning of the control layer (10) in order to form word lines (WL); and
   l) removal of the third insulation layer (9), a third portion of the second insulation layer (4), a third portion of the charge storage layer (3) and a second portion of the first insulation layer (2) using the patterned control layer (10) in order to form locally delimited memory locations (LB, RB).

2. The method as claimed in Patent claim 1, characterized by the following step
   m) formation of a fourth insulation layer (11).

3. Method according to Patent claim 1,
   characterized in that an anisotropic etching is carried out in step d), f), g) and/or l).

4. Method according to Patent claim 1, characterized in that a wet etching is carried out in step h).

5. Method according to Patent claim 1, characterized in that, in step e), an ion implantation using the first insulation layer (2) as screen material is used and the first insulation layer (2) is 5 subsequently removed (10).

6. Method according to Patent claim 1, characterized in that,
   in step d), the first insulation layer (2) is furthermore removed; and in step e), an ion implantation is carried out directly into the substrate (1).

7. Method according to Patent claim 1,
   characterized in that a thickness of the first insulation layer (2) is greater than a material thickness for direct tunnelling.

8. Method according to Patent claim 1,
   characterized in that the first, second, third and/or fourth insulation layer (2,4,9,11) comprises $SiO_2$.

9. Method according to Patent claim 1,
   characterized in that the electrically non-conductive charge storage layer (3) comprises $Si_xO_y$ or $Si_3N_4$.

10. Method according to Patent claim 1,
    characterized in that the control layer (10) and/or the mask layer (5) comprises doped polysilicon, a metal and/or siliconized semiconductor material.

11. Method according to Patent claim 1,
    characterized in that the substrate (1) comprises Si.

* * * * *

UNITED STATES PATENT AND TRADEMARK OFFICE
CERTIFICATE OF CORRECTION

| | |
|---|---|
| PATENT NO. | : 7,528,038 B2 |
| APPLICATION NO. | : 10/501406 |
| DATED | : May 5, 2009 |
| INVENTOR(S) | : Franz Schuler et al. |

Page 1 of 1

It is certified that error appears in the above-identified patent and that said Letters Patent is hereby corrected as shown below:

<u>In the Claims</u>

In column 8, claim 5, line 38, before "subsequently removed" replace "5" with --(5)--.

Signed and Sealed this

Third Day of November, 2009

David J. Kappos
*Director of the United States Patent and Trademark Office*